(12) United States Patent
Chen

(10) Patent No.: US 9,685,411 B2
(45) Date of Patent: Jun. 20, 2017

(54) INTEGRATED CIRCUIT DIES HAVING ALIGNMENT MARKS AND METHODS OF FORMING SAME

(71) Applicant: Taiwan Semiconductor Manufacturing Company, Ltd., Hsin-Chu (TW)

(72) Inventor: Hsien-Wei Chen, Hsin-Chu (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 0 days.

(21) Appl. No.: 14/858,923

(22) Filed: Sep. 18, 2015

(65) Prior Publication Data

US 2017/0084544 A1  Mar. 23, 2017

(51) Int. Cl.

| | |
|---|---|
| *H01L 21/76* | (2006.01) |
| *H01L 23/544* | (2006.01) |
| *H01L 23/498* | (2006.01) |
| *H01L 23/31* | (2006.01) |
| *H01L 21/78* | (2006.01) |
| *H01L 23/00* | (2006.01) |
| *H01L 21/56* | (2006.01) |
| *H01L 21/48* | (2006.01) |

(52) U.S. Cl.
CPC ........ *H01L 23/544* (2013.01); *H01L 21/4853* (2013.01); *H01L 21/56* (2013.01); *H01L 21/78* (2013.01); *H01L 23/3171* (2013.01); *H01L 23/49811* (2013.01); *H01L 24/02* (2013.01); *H01L 2223/54426* (2013.01); *H01L 2224/02371* (2013.01); *H01L 2224/02373* (2013.01)

(58) Field of Classification Search
CPC ....... H01L 2924/14; H01L 2924/01079; H01L 2924/01013; H01L 2824/01029; H01L 2924/01078; H01L 25/0657; H01L 25/105; H01L 2224/48091
USPC ....... 257/773, 777, 778, 725, 726, 686, 797; 438/618, 125, 107, 110, 18, 666, 401, 438/109
See application file for complete search history.

(56) References Cited

U.S. PATENT DOCUMENTS

| | | | |
|---|---|---|---|
| 6,975,040 B2 * | 12/2005 | Dower | H01L 23/544 257/797 |
| 7,954,234 B2 * | 6/2011 | Kodani | H05K 3/205 216/18 |
| 8,358,001 B2 * | 1/2013 | Yang | H01L 21/568 257/690 |
| 8,361,842 B2 | 1/2013 | Yu et al. | |
| 8,629,568 B2 | 1/2014 | Lin et al. | |
| 8,680,647 B2 | 3/2014 | Yu et al. | |
| 8,703,542 B2 | 4/2014 | Lin et al. | |
| 8,759,964 B2 | 6/2014 | Pu et al. | |
| 8,778,738 B1 | 7/2014 | Lin et al. | |
| 8,785,299 B2 | 7/2014 | Mao et al. | |
| 8,803,306 B1 | 8/2014 | Yu et al. | |
| 8,809,996 B2 | 8/2014 | Chen et al. | |
| 8,829,676 B2 | 9/2014 | Yu et al. | |

(Continued)

*Primary Examiner* — Thinh T Nguyen
(74) *Attorney, Agent, or Firm* — Slater Matsil, LLP

(57) ABSTRACT

Dies having alignment marks and methods of forming the same are provided. A method includes forming a device on a substrate. A plurality of contact pads is formed over the substrate and the device. Simultaneously with forming the plurality of contact pads, one or more alignment marks are formed over the substrate and the device.

20 Claims, 9 Drawing Sheets

(56) References Cited

U.S. PATENT DOCUMENTS

| | | | |
|---|---|---|---|
| 8,877,554 B2 | 11/2014 | Tsai et al. | |
| 2005/0090071 A1* | 4/2005 | Dower | H01L 23/544 |
| | | | 438/401 |
| 2008/0245549 A1* | 10/2008 | Kodani | H05K 3/205 |
| | | | 174/126.1 |
| 2011/0291288 A1 | 12/2011 | Wu et al. | |
| 2013/0026468 A1 | 1/2013 | Yoshimuta et al. | |
| 2013/0062760 A1 | 3/2013 | Hung et al. | |
| 2013/0062761 A1 | 3/2013 | Lin et al. | |
| 2013/0122655 A1* | 5/2013 | Yu | H01L 21/561 |
| | | | 438/121 |
| 2013/0168848 A1 | 7/2013 | Lin et al. | |
| 2013/0307140 A1 | 11/2013 | Huang et al. | |
| 2014/0203429 A1 | 7/2014 | Yu et al. | |
| 2014/0225222 A1 | 8/2014 | Yu et al. | |
| 2014/0252558 A1* | 9/2014 | Yu | H01L 23/544 |
| | | | 257/618 |
| 2014/0252646 A1 | 9/2014 | Hung et al. | |
| 2014/0264930 A1 | 9/2014 | Yu et al. | |
| 2014/0312511 A1* | 10/2014 | Nakamura | H01L 25/065 |
| | | | 257/777 |
| 2015/0155248 A1* | 6/2015 | Lin | H01L 23/49822 |
| | | | 257/737 |

\* cited by examiner

INTEGRATED CIRCUIT DIES HAVING ALIGNMENT MARKS AND METHODS OF FORMING SAME

BACKGROUND

Semiconductor devices are used in a variety of electronic applications, such as personal computers, cell phones, digital cameras, and other electronic equipment. Semiconductor devices are typically fabricated by sequentially depositing insulating or dielectric layers, conductive layers, and semiconductive layers of material over a semiconductor substrate, and patterning the various material layers using lithography to form circuit components and elements thereon. Dozens or hundreds of integrated circuits are typically manufactured on a single semiconductor wafer. The individual dies are singulated by sawing the integrated circuits along scribe lines. The individual dies are then packaged separately, in multi-chip modules, or in other types of packaging.

The semiconductor industry has experienced rapid growth due to continuous improvement in the integration density of a variety of electronic components (e.g., transistors, diodes, resistors, capacitors, etc.). For the most part, this improvement in integration density has come from repeated reductions in minimum feature size (e.g., shrinking the semiconductor process node towards the sub-20 nm node), which allows more components to be integrated into a given area. As the demand for miniaturization, higher speed, and greater bandwidth, as well as lower power consumption and latency has grown recently, there has grown a need for smaller and more creative packaging techniques for semiconductor dies.

As semiconductor technologies further advance, stacked semiconductor devices, e.g., three dimensional integrated circuits (3DICs), have emerged as an effective alternative to further reduce the physical size of semiconductor devices. In a stacked semiconductor device, active circuits such as logic, memory, processor circuits, and the like are fabricated on different semiconductor wafers. Two or more semiconductor wafers may be installed or stacked on top of one another to further reduce the form factor of the semiconductor device. Package-on-package (POP) devices are one type of 3DIC wherein dies are packaged and are then packaged together with another packaged die or dies.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1A:
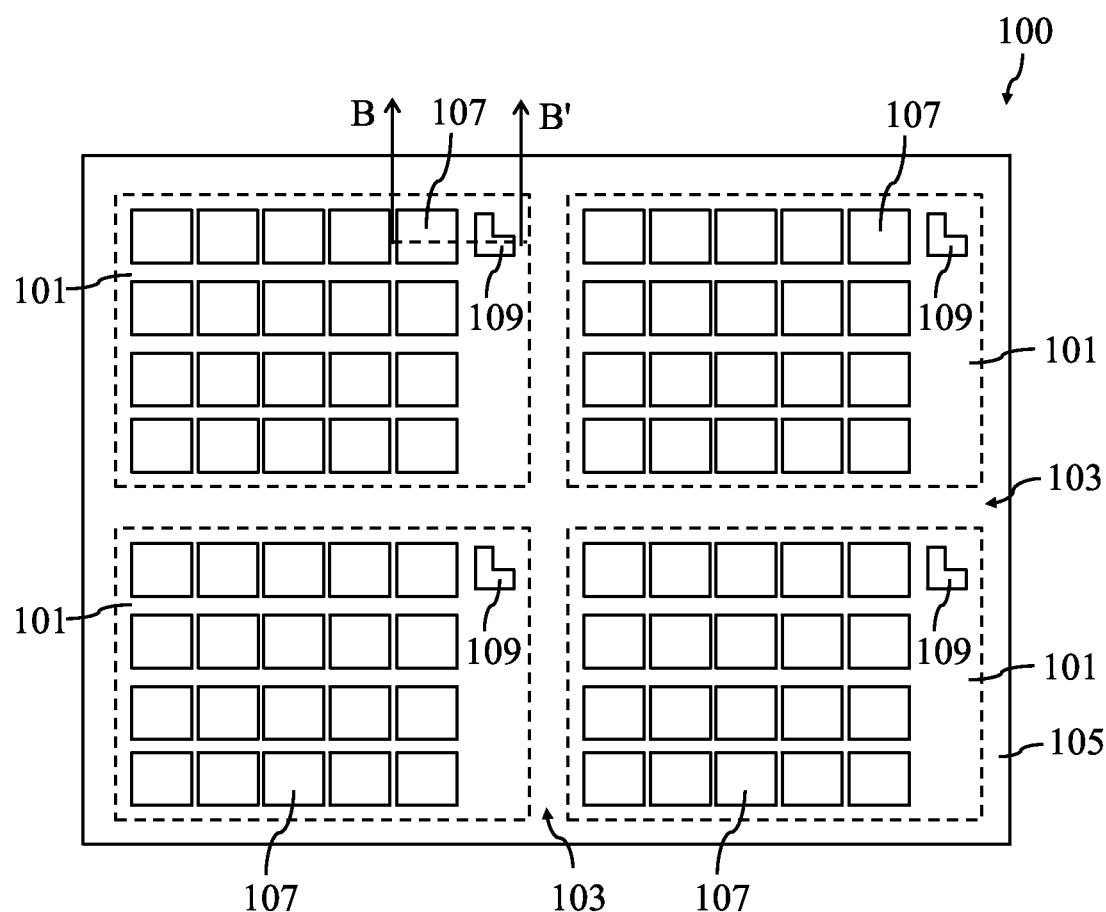
FIGS. 1A-4B are top and cross-sectional views of various processing steps during fabrication of integrated circuit dies having alignment marks in accordance with some embodiments.

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Before addressing the illustrated embodiments specifically, certain advantageous features and aspects of some embodiments will be addressed generally. Described below are various integrated circuit dies having alignment marks and methods for forming such integrated circuit dies. In addition, methods of forming integrated circuit packages using integrated circuit dies are described below. By forming integrated circuit dies having one or more alignment marks, undesired shift or rotation of integrated circuit dies may be reduced or avoided while forming integrated circuit packages. Moreover, damage to integrated circuit dies caused by misalignment may be reduced or avoided.

FIGS. 1A-4B are top and cross-sectional views of various processing steps during fabrication of integrated circuit dies having alignment marks in accordance with some embodiments, wherein an "A" figure represents a top view and a "B" figure represents a cross-sectional view along the B-B' line of the respective "A" figure.

Figure 1B:
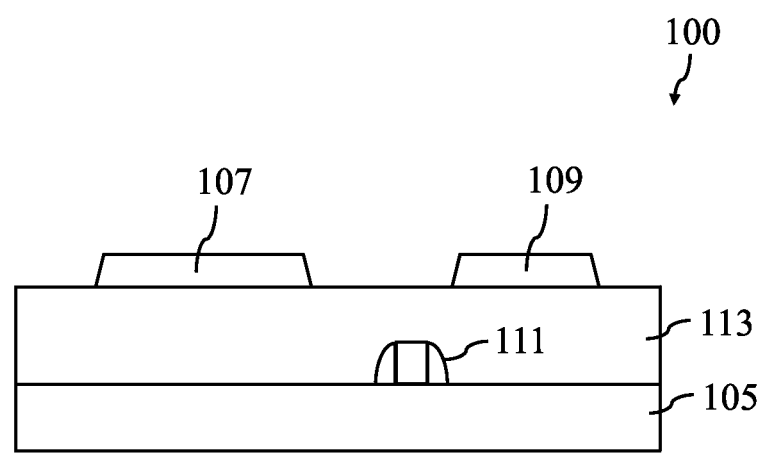

Referring to FIGS. 1A and 1B, a portion of a workpiece 100 having die regions 101 separated by scribe lines 103 (also referred to as dicing lines or dicing streets) is illustrated. As described below in greater detail, the workpiece 100 will be diced along the scribe lines 103 to form individual integrated circuit dies (such as an integrated circuit die 500 illustrated in FIG. 5). In some embodiments, the workpiece 100 comprises a substrate 105, one or more active and/or passive devices 111 on the substrate 105, and one or more metallization layers 113 over the substrate 105. In some embodiments, the substrate 105 may be formed of silicon, although it may also be formed of other group III, group IV, and/or group V elements, such as silicon, germanium, gallium, arsenic, and combinations thereof. The substrate 105 may also be in the form of silicon-on-insulator (SOI). The SOI substrate may comprise a layer of a semiconductor material (e.g., silicon, germanium and/or the like) formed over an insulator layer (e.g., buried oxide and/or the like), which is formed on a silicon substrate. In addition, other substrates that may be used include multi-layered substrates, gradient substrates, hybrid orientation substrates, any combinations thereof and/or the like. In other embodiments, the substrate 105 may comprise a dielectric material such as silicon oxide, aluminum oxide, the like, or a combination thereof.

In some embodiments, the one or more active and/or passive devices 111 (represented by a single transistor in FIG. 1B) may include various n-type metal-oxide semiconductor (NMOS) and/or p-type metal-oxide semiconductor (PMOS) devices such as transistors, capacitors, resistors, diodes, photo-diodes, fuses and/or the like. In some embodiments, the integrated circuit dies may be discrete semiconductor device chips (sometimes referred to as surface mount devices (SMDs) or integrated passive devices (IPDs)). In such embodiments, the substrate 105 may include various devices such as RLC circuits, capacitors, inductors, transformers, baluns, micro-stripes, co-planar waveguides, the like, and may be substantially free of active devices.

The one or more metallization layers 113 may include an inter-layer dielectric (ILD)/inter-metal dielectric layers (IMDs) formed over the substrate 105. The ILD/IMDs may be formed, for example, of a low-K dielectric material, such as phosphosilicate glass (PSG), borophosphosilicate glass (BPSG), FSG, $SiO_xC_y$, Spin-On-Glass, Spin-On-Polymers, silicon carbon material, compounds thereof, composites thereof, combinations thereof, or the like, by any suitable method known in the art, such as a spin-on coating method, chemical vapor deposition (CVD), plasma enhanced CVD (PECVD), the like, or a combination thereof. In some embodiments, interconnect structures may be formed in the ILD/IMDs using, for example, a damascene process, a dual damascene process, or the like. In some embodiments, interconnect structures may comprise copper, a copper alloy, silver, gold, tungsten, tantalum, aluminum, or the like. In some embodiments, the interconnect structures may provide electrical connections between the one or more active and/or passive devices 111 formed on the substrate 105.

Referring further to FIGS. 1A and 1B, in some embodiments, top views of the die regions 101 and, consequently, top views of integrated circuit dies that are formed after dicing the workpiece 100 may be geometrically symmetrical under 90°, 180°, and/or 270° rotations. However, the die regions 101 and, consequently, integrated circuit dies that are formed after dicing the workpiece 100 may not be functionally symmetrical under 90°, 180°, and/or 270° rotations. Such an asymmetry of integrated circuit dies may be caused by an asymmetrical arrangement of various active and/or passive devices in integrated circuit dies. Accordingly, one or more alignment marks may be formed on each integrated circuit die to identify a desired orientation of integrated circuit dies.

In some embodiments, contact pads 107 and alignment marks 109 are formed over the one or more metallization layers 113. The contact pads 107 may be electrically coupled to the one or more active and/or passive devices 111 through the one or more metallization layers 113, while the alignment marks 109 may be electrically isolated from the one or more active and/or passive devices 111. In some embodiments, the contact pads 107 and the alignment marks 109 may comprise a conductive material such as aluminum, copper, tungsten, silver, gold, the like, or a combination thereof. In some embodiments, a conductive material may be formed over the substrate 105 and the one or more active and/or passive devices 111 using, for example, physical vapor deposition (PVD), atomic layer deposition (ALD), electro-chemical plating, electroless plating, the like, or a combination thereof. Subsequently, the conductive material is patterned to form the contact pads 107 and the alignment marks 109. Accordingly, the contact pads 107 and the alignment marks 109 may have a same thickness. In some embodiments, the conductive material may be patterned using photolithography techniques. Generally, photolithography techniques involve depositing a photoresist material (not shown), which is subsequently irradiated (exposed) and developed to remove a portion of the photoresist material. The remaining photoresist material protects the underlying material, such as the conductive material of the contact pads 107 and the alignment mark 109 from subsequent processing steps, such as etching. A suitable etching process, such as a reactive ion etch (RIE) or other dry etch, an isotropic or anisotropic wet etch, or any other suitable etch or patterning process may be applied to the conductive material to remove exposed portions of the conductive material and form the contact pads 107 and the alignment marks 109. In some embodiments wherein the conductive material is aluminum, the conductive material may be etched using a mixture of 80% phosphoric acid, 5% nitric acid, 5% acetic acid, and 10% de-ionized (DI) water. Subsequently, the photoresist material may be removed using, for example, an ashing process followed by a wet clean process. As described below in greater detail, connectors will be formed on the contact pads 107.

In the illustrated embodiment, top-view shapes of the contact pads 107 are rectangles, and top-view shapes of the alignment marks 109 are L-shaped polygons. However, in other embodiments, the top-view shapes of the contact pads 107 may be circles, ovals, or polygons such as triangles, squares, or the like, and the top-view shapes of the alignment marks 109 may be circles, ovals, or polygons such as triangles, squares, rectangles, or the like. In some embodiments, the top-view shapes of the contact pads 107 and the alignment marks 109 may be similar. In other embodiments, the top-view shapes of the contact pads 107 and the alignment marks 109 may be different.

Figure 2A:
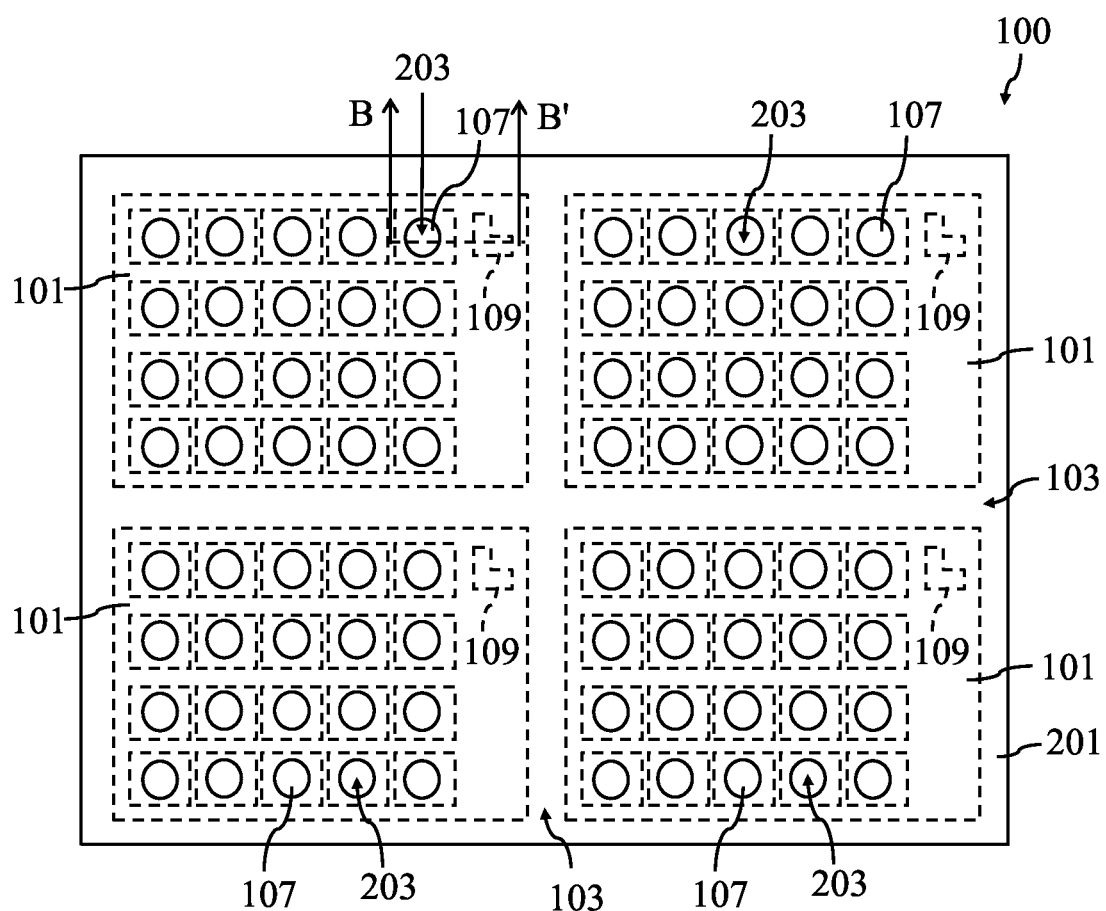
Figure 2B:
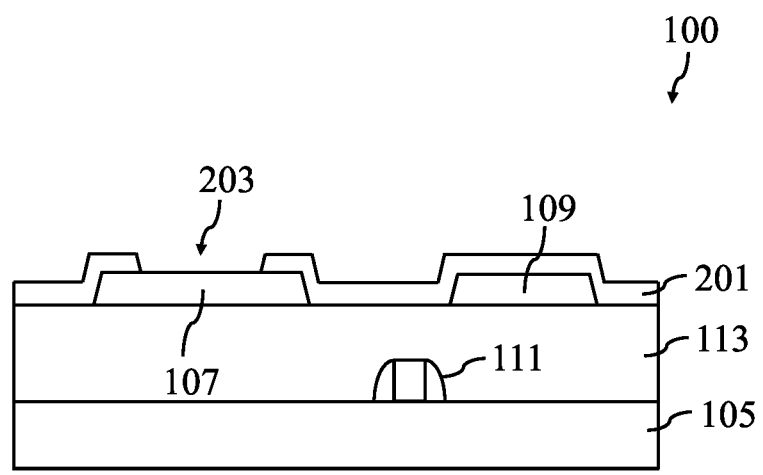

Referring to FIGS. 2A and 2B, a passivation layer 201 is formed over the substrate 105, the contact pads 107 and the alignment marks 109. In some embodiments, the passivation layer 201 may comprise one or more layers of photo-patternable dielectric materials such as polybenzoxazole (PBO), polyimide (PI), benzocyclobutene (BCB), or the like, and may be formed using a spin-on coating process, or the like. Such photo-patternable dielectric materials may be patterned using similar photolithography methods as a photoresist material. In other embodiments, the passivation layer 201 may comprise one or more layers of non-photo-patternable dielectric materials such as silicon nitride, silicon oxide, phosphosilicate glass (PSG), borosilicate glass (BSG), boron-doped phosphosilicate glass (BPSG), or the like, and may be formed using chemical vapor deposition (CVD), PVD, ALD, a spin-on coating process, the like, or a combination thereof.

Subsequently, openings 203 are formed in the passivation layer 201 to expose the contact pads 107. In some embodiments in which the passivation layer 201 is formed of a photo-patternable dielectric material, the passivation layer 201 may be patterned using similar photolithography methods as a photoresist material. In other embodiments in which the passivation layer 201 is formed of a non-photo-patternable dielectric material, a photoresist material (not shown) is formed over the passivation layer 201. The photoresist material is subsequently irradiated (exposed) and developed to remove a portion of the photoresist material. Subsequently, exposed portions of the passivation layer 201 are removed using, for example, a suitable etching process to form the openings. In some embodiments wherein the passivation layer 201 is formed of silicon oxide, the passivation layer 201 is etched using, for example, buffered hydrofluoric acid (HF). In other embodiments wherein the passivation layer 201 is formed of silicon nitride, the passivation layer 201 is etched using, for example, hot phosphoric acid ($H_3PO_4$). Subsequently, the photoresist material may be removed using, for example, an ashing process followed by a wet clean process.

Figure 3A:
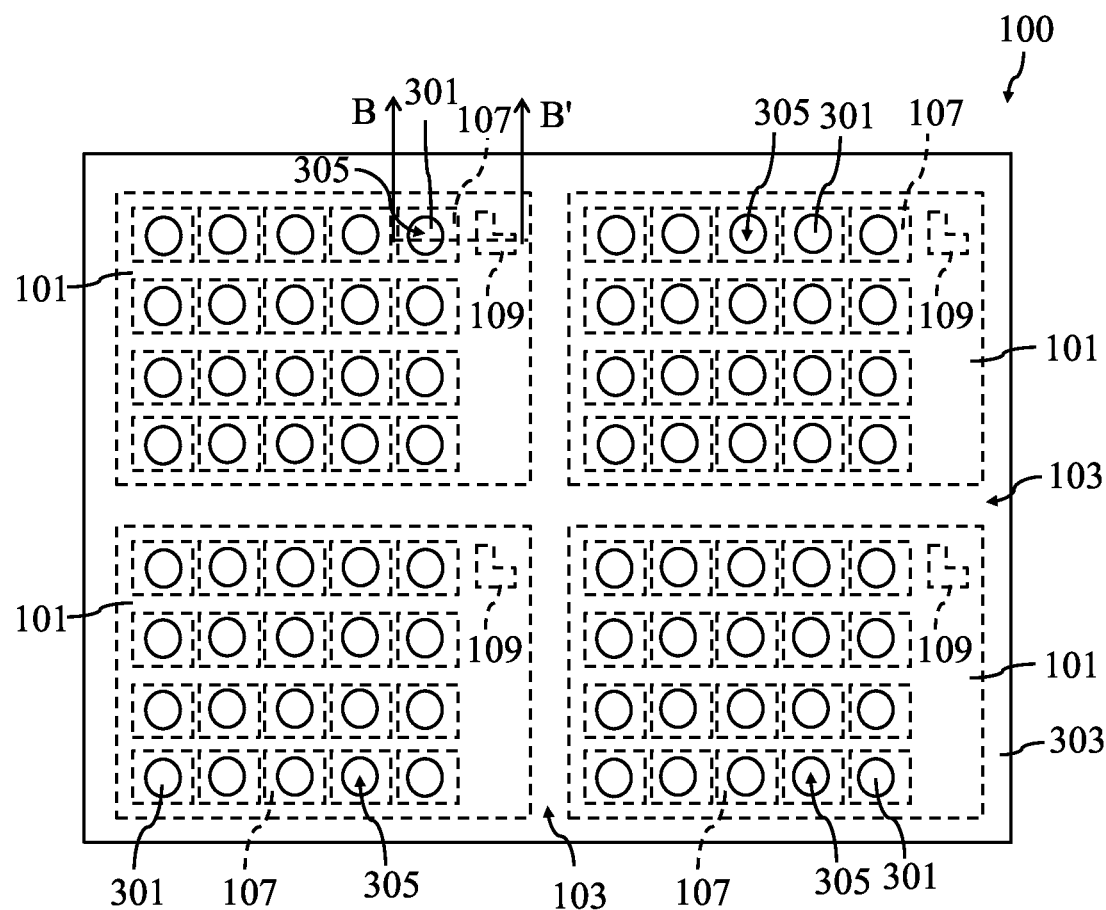
Figure 3B:
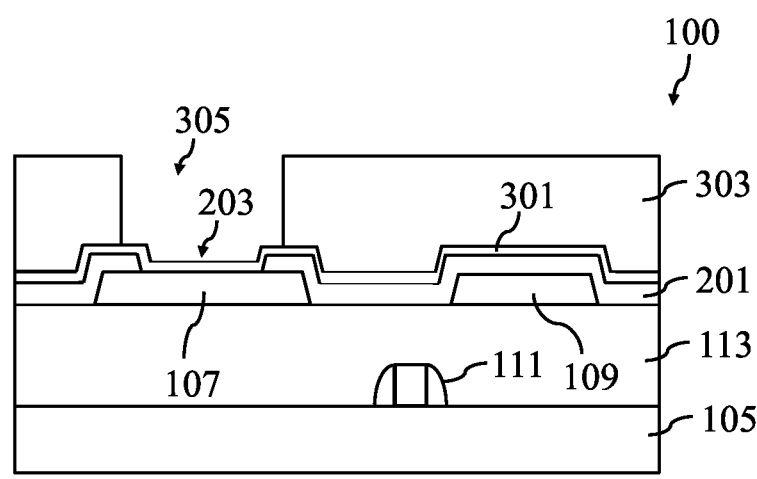

Referring to FIGS. 3A and 3B, in some embodiments, a seed layer 301 is formed on the passivation layer 201 and in bottoms and sidewalls of the openings 203. The seed layer 301 may comprise copper, titanium, nickel, gold, the like, or a combination thereof, and may be formed using an electrochemical plating process, ALD, PVD, sputtering, the like, or a combination thereof. In some embodiments, a sacrificial layer 303 is formed over the seed layer 301. Openings 305 are formed in the sacrificial layer 303 to expose portions of the seed layer 301 disposed in the openings 203. In some embodiments wherein the sacrificial layer 303 comprises a photoresist material, the sacrificial layer 303 may be patterned using suitable photolithography methods. As described below in greater detail, connectors will be formed in the openings 203 and 305.

Figure 4A:
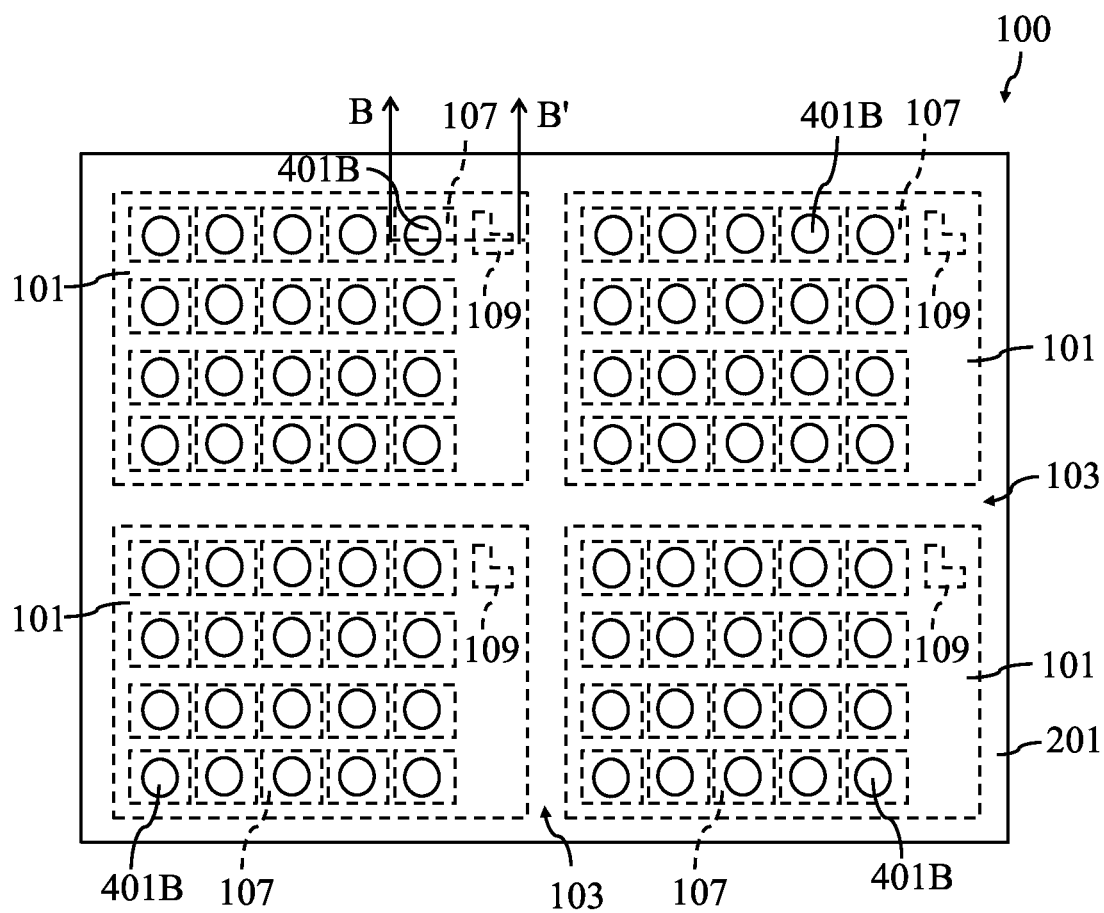
Figure 4B:
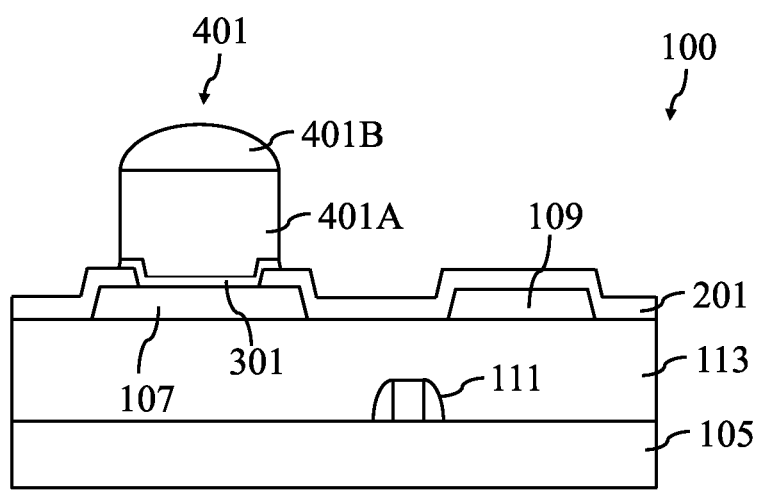

Referring to FIGS. 4A and 4B, connectors 401 are formed in the openings 203 and 305. In some embodiments, the openings 203 and 305 are filled with a conductive material such as copper, aluminum, nickel, gold, silver, palladium, the like, or a combination thereof using an electro-chemical plating process, an electroless plating process, ALD, PVD, the like, or a combination thereof to form conductive pillars 401A. In some embodiments, the connectors 401 may further comprise cap layers 401B that may be formed on the top of the conductive pillars 401A. The cap layers 401B may include a solder, nickel, tin, tin-lead, gold, silver, palladium, indium, nickel-palladium-gold, nickel-gold, the like, or a combination thereof and may be formed by a plating process, or the like. After the formation of the connectors 401 is completed, the sacrificial layer 303 is removed. In some embodiments wherein the sacrificial layer 303 comprises a photoresist material, the sacrificial layer 303 may be removed using, for example, an ashing process followed by a wet clean process. Subsequently, exposed portions of the seed layer 301 are removed using, for example, a suitable etching process. Remaining portions of the seed layer 301 may be also referred to as underbump metallizations (UBMs) 301. In other embodiments, connectors 401 may be solder balls, controlled collapse chip connection (C4) bumps, ball grid array (BGA) balls, micro bumps, electroless nickel-electroless palladium-immersion gold technique (ENEPIG) formed bumps, or the like. In some embodiments in which the connectors 401 are solder bumps, the connectors 401 may be formed by initially forming a layer of solder through commonly used methods such as evaporation, electroplating, printing, solder transfer, ball placement, or the like. Once the layer of solder has been formed, a reflow may be performed in order to shape the material into the desired bump shapes.

In the illustrated embodiment, top-view shapes of the connectors 401 are circles. However, in other embodiments, the top-view shapes of the connectors 401 may be ovals, or polygons such as triangles, squares, or the like. Furthermore, in the illustrated embodiment, the die region 101 comprises twenty contact pads (such as the contact pads 107), twenty connectors (such as the connectors 401), a single alignment mark (such as the alignment mark 109), and a single passivation layer (such as the passivation layer 201). One skilled in the art will recognize that the number of passivation layers, contact pads, alignment marks, and the connectors is provided for illustrative purpose only and is not limiting the scope of the present disclosure. In other embodiments, the die region 101 may comprise an appropriate number of passivation layers, contact pads, alignment marks, and the connectors depending on design requirements for subsequently formed integrated circuit dies.

Referring further to FIGS. 4A and 4B, the workpiece 100 is diced along the scribe lines 103 to form individual integrated circuit dies. In some embodiments, the workpiece 100 may be diced using, for example, etching, sawing, laser ablation, the like, or a combination thereof. Subsequently, each of the integrated circuit dies may be tested to identify known good dies (KGDs) for further processing. As described below in greater detail, the integrated circuit dies will be used to form integrated circuit packages.

Figure 5:
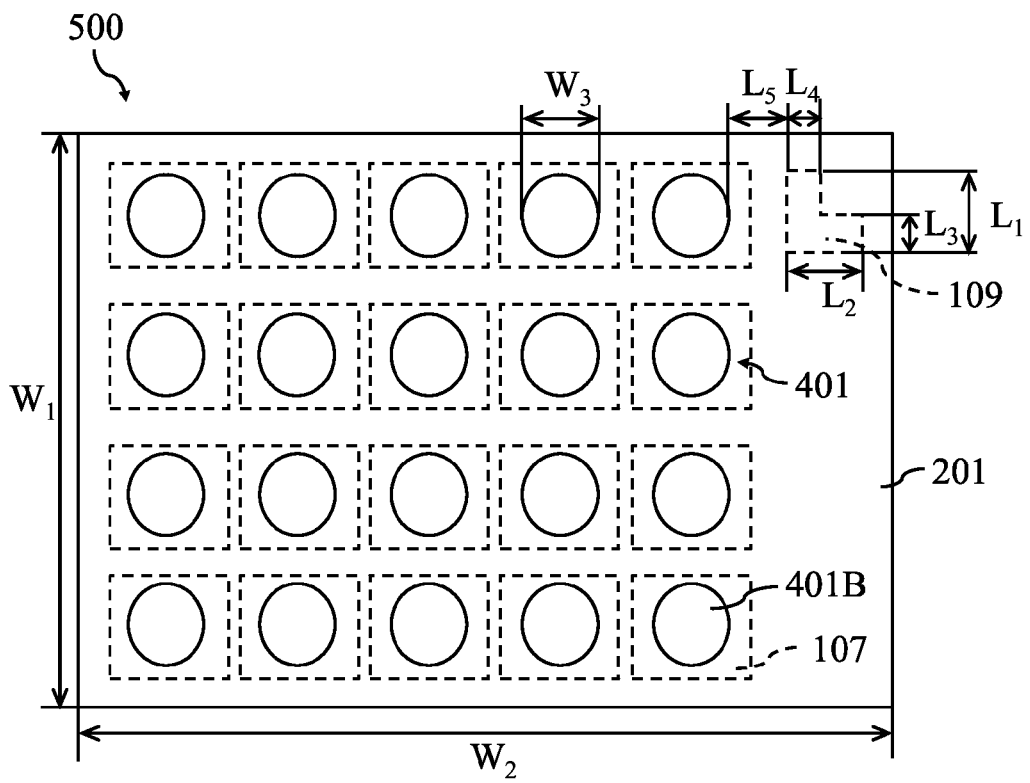
FIG. 5 is a top view of an integrated circuit die in accordance with some embodiments.

FIG. 5 is a top view of an integrated circuit die 500 formed after dicing the workpiece 100 in accordance with some embodiments. In the illustrated embodiment, a top-view shape of the alignment mark 109 is an L-shaped polygon. A particular orientation of the alignment mark 109 as illustrated in FIG. 5 is provided for illustration only. In other embodiments, the alignment mark 109 may be rotated by a desired angle as viewed from top. In some embodiments, a first side of the integrated circuit die 500 may have a first width $W_1$ between about 0.5 mm and about 3.0 mm, and a second side of the integrated circuit die 500 may have a second width $W_2$ between about 0.5 um and about 3.0 um. In some embodiments, the connectors 401 may have a width $W_3$ between about 35 um and about 55 um. In some embodiment, a first longest side of the alignment mark 109 (parallel to the first side of the integrated circuit die 500) may have a length $L_1$ between about $W_1/20$ and about $W_1/10$, a second longest side of the alignment mark 109 (parallel to the second side of the integrated circuit die 500) may have a length $L_2$ between about $W_2/20$ and about $W_2/10$, a first shortest side of the alignment mark 109 (parallel to the first side of the integrated circuit die 500) may have a length $L_3$ between about $L_1/2$ and about $L_1/3$, a second shortest side of the alignment mark 109 (parallel to the second side of the integrated circuit die 500) may have a length $L_4$ between about $L_2/2$ and about $L_2/3$. In some embodiments, a distance $L_5$ between the alignment mark 109 and the nearest connector 401 may be greater than or equal to $W_3/2$.

Figure 6:
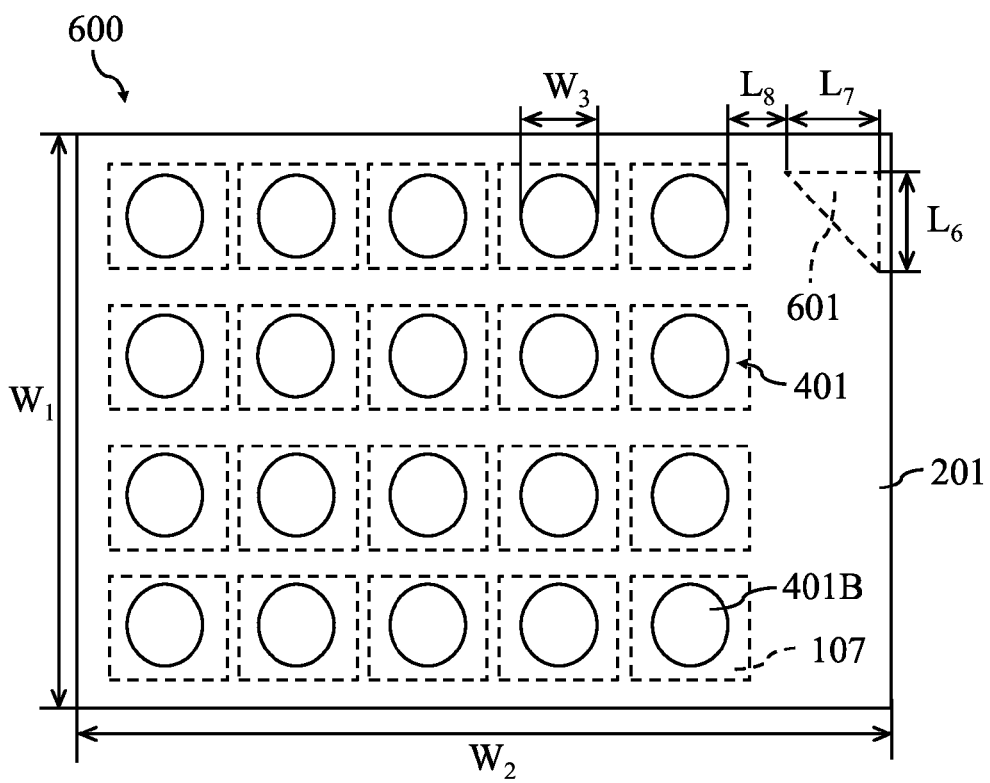
FIG. 6 is a top view of an integrated circuit die in accordance with some embodiments.

FIG. 6 is a top view of an integrated circuit die 600 in accordance with some embodiments. In some embodiments, the integrated circuit die 600 may be formed using similar materials and methods as described above with reference to FIGS. 1A-4B, with similar elements labeled with similar numerical references, and the description is not repeated herein. In some embodiments, an alignment mark 601 may be formed at a corner of the integrated circuit die 600 and may have a triangular shape as viewed from top. In some embodiments, the alignment mark 601 may be formed using similar material and methods as the alignment mark 109 described above with reference to FIGS. 1A and 1B, and the description is not repeated herein. A particular orientation of the alignment mark 601 as illustrated in FIG. 6 is provided for illustration only. In other embodiments, the alignment mark 601 may be rotated by a desired angle as viewed from top. In some embodiments, a first side of the integrated circuit die 600 may have a first width $W_1$ between about 0.5 mm and about 3 mm, and a second side of the integrated circuit die 600 may have a second width $W_2$ between about 0.5 mm and about 3 mm. In some embodiments, the connectors 401 may have a width $W_3$ between about 35 um and about 55 um. In some embodiment, a first side of the alignment mark 601 (parallel to the first side of the integrated circuit die 600) may have a length $L_6$ between about $W_1/20$ and about $W_1/10$, and a second side of the alignment mark 601 (parallel to the second side of the integrated circuit die 600) may have a length $L_7$ between about $W_2/20$ and about $W_2/10$. In some embodiments, a distance $L_8$ between the alignment mark 601 and the nearest connector 401 may be greater than or equal to $W_3/2$.

Figure 7:
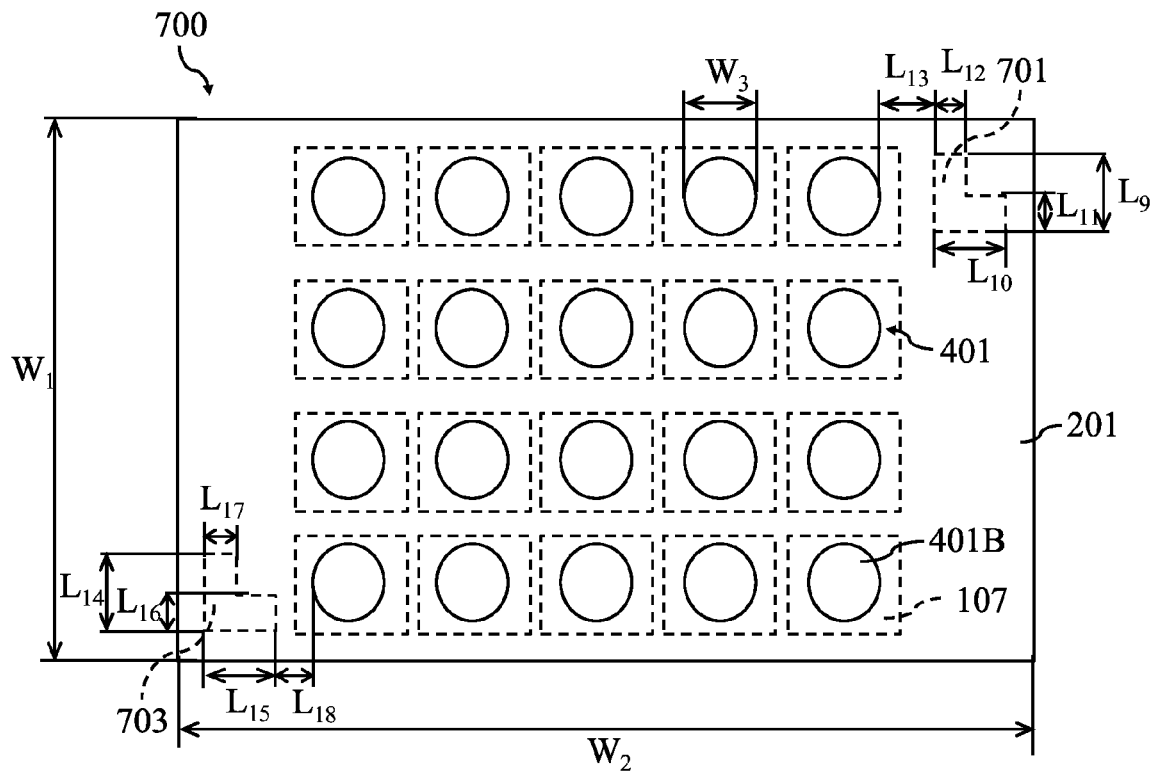
FIG. 7 is a top view of an integrated circuit die in accordance with some embodiments.

FIG. 7 is a top view of an integrated circuit die 700 in accordance with some embodiments. In some embodiments, the integrated circuit die 700 may be formed using similar materials and methods as described above with reference to FIGS. 1A-4B, with similar elements labeled with similar numerical references, and the description is not repeated herein. In some embodiments, a first alignment mark 701 and a second alignment mark 703 are formed at opposite corners of the integrated circuit die 700. In some embodiments, the first alignment mark 701 and the second alignment mark 703 may be formed using similar material and methods as the alignment mark 109 described above with reference to FIGS. 1A and 1B, and the description is not repeated herein. In some embodiments, top-view shapes of the first alignment mark 701 and the second alignment mark 703 are L-shaped polygons. A particular orientation of the first alignment mark 701 and the second alignment mark 703 as illustrated in FIG. 7 is provided for illustration only. In other embodiments, the first alignment mark 701 and the second alignment mark 703 may be rotated by a desired angle as viewed from top. In some embodiments, a first side of the integrated circuit die 700 may have a first width $W_1$ between about 0.5 mm and about 3 mm, and a second side of the integrated circuit die 700 may have a second width $W_2$ between about 0.5 mm and about 3 mm. In some embodiments, the connectors 401 may have a width $W_3$ between about 35 um and about 55 um. In some embodiment, a first longest side of the first alignment mark 701 (parallel to the first side of the integrated circuit die 700) may have a length $L_9$ between about $W_1/20$ and about $W_1/10$, a second longest side of the first alignment mark 701 (parallel to the second side of the integrated circuit die 700) may have a length $L_{10}$ between about $W_2/20$ and about $W_2/10$, a first shortest side of the first alignment mark 701 (parallel to the first side of the integrated circuit die 700) may have a length $L_{11}$ between about $L_9/2$ and about $L_9/3$, and a second shortest side of the first alignment mark 701 (parallel to the second side of the integrated circuit die 700) may have a length $L_{12}$ between about $L_{10}/2$ and about $L_{10}/3$. In some embodiments, a first longest side of the second alignment mark 703 (parallel to the first side of the integrated circuit die 700) may have a length $L_{14}$ between about $W_1/20$ and about $W_1/10$, a second longest side of the second alignment mark 703 (parallel to the second side of the integrated circuit die 700) may have a length $L_{15}$ between about $W_2/20$ and about $W_2/20$, a first shortest side of the second alignment mark 703 (parallel to the first side of the integrated circuit die 700) may have a length $L_{16}$ between about $L_{14}/2$ and about $L_{14}/3$, and a second shortest side of the second alignment mark 703 (parallel to the second side of the integrated circuit die 700) may have a length $L_{17}$ between about $L_{15}/2$ and about $L_{15}/3$. In some embodiments, a distance $L_{13}$ between the first alignment mark 701 and the nearest connector 401 may be greater than or equal to $W_3$, and a distance $L_{18}$ between the second alignment mark 703 and the nearest connector 401 may be greater than or equal to $W_3/2$.

Figure 8:
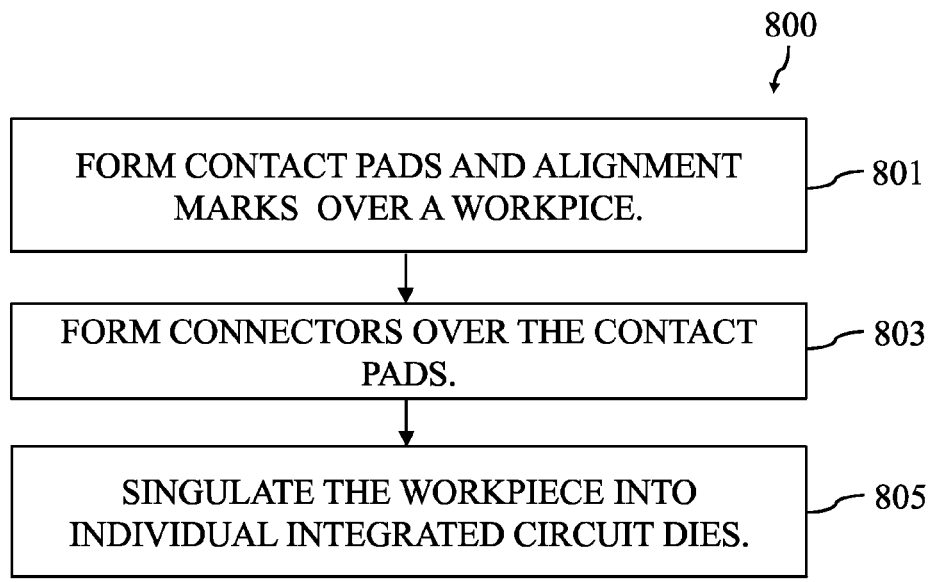
FIG. 8 is a flow diagram illustrating a method of forming integrated circuit dies having alignment marks in accordance with some embodiments.

FIG. 8 is a flow diagram illustrating a method 800 of forming integrated circuit dies having alignment marks (such as the integrated circuit dies 500, 600, and/or 700) in accordance with some embodiments. The method starts with step 801, wherein contact pads (such as the contact pads 107) and alignment marks (such as the alignment mark 109) are formed over a workpiece (such as the workpiece 100) as described above with reference to FIGS. 1A and 1B. In step 803, connectors (such as the connectors 401) are formed over the contact pads as described above with reference to FIGS. 2A-4B. In step 805, the workpiece is diced into individual integrated circuit dies as described above with reference to FIGS. 4A and 4B.

FIGS. 9-13 are cross-sectional views of various exemplary processing steps during fabrication of integrated circuit packages in accordance with some embodiments. As described below in greater detail, integrated circuit dies (such as, for example, the integrated circuit dies 500, 600, and 700 illustrated in FIGS. 5-7, respectively) will be used to form integrated circuit packages (such as integrated circuit packages 1215 illustrated in FIG. 12). One skilled in the art will appreciate that the processing steps as described below are provided for illustration only and the integrated circuit dies may be packaged using any suitable packaging method.

Figure 9:
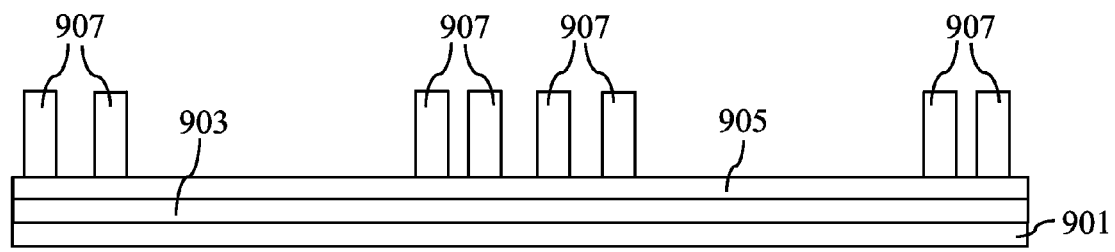
FIGS. 9-13 are cross-sectional views of various processing steps during fabrication of integrated circuit packages in accordance with some embodiments.

Referring first to FIG. 9, in some embodiments, a release layer 903 is formed over a carrier 901, and one or more dielectric layers 905 are formed over the release layer 903 to start forming integrated circuit packages. In some embodiments, the carrier 901 may be formed of quartz, glass, or the like, and provides mechanical support for subsequent operations. In some embodiments, the release layer 903 may comprise a light to heat conversion (LTHC) material, a UV adhesive, or the like, and may be formed using a spin-on coating process, a printing process, a lamination process, or the like. In some embodiments in which the release layer 903 is formed of a LTHC material, the release layer 903 when exposed to light partially or fully loses its adhesive strength and the carrier 901 can be easily removed from a back side of a subsequently formed structure. In some embodiments, the one or more dielectric layers 905 may be formed using similar materials and methods as the passivation layer 201 described above with reference to FIGS. 2A and 2B, and the description is not repeated herein.

Referring further to FIG. 9, conductive vias 907 are formed on the one or more dielectric layers 905. In some embodiments, a seed layer (not shown) may be interposed between the conductive vias 907 and the one or more dielectric layers 905. In some embodiments, the seed layer and the conductive vias 907 may be formed using similar materials and method as the seed layer 301 and the conductive pillars 401A, respectively, described above with reference to FIGS. 3A-4B, and the description is not repeated herein.

Figure 10:
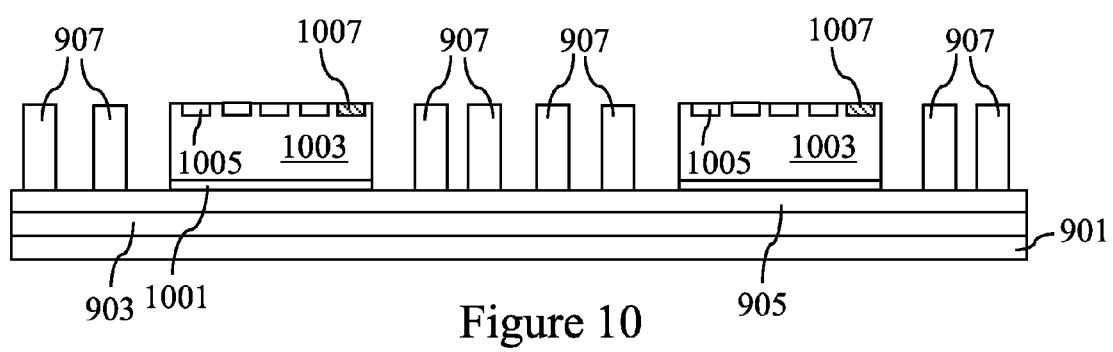

Referring to FIG. 10, integrated circuit dies 1003 are attached to the one or more dielectric layers 905 using adhesive layers 1001. In some embodiments, the integrated circuit dies 1003 are placed on the one or more dielectric layers 905 using, for example, a pick-and-place apparatus. In other embodiments, the integrated circuit dies 1003 may be placed on the one or more dielectric layers 905 manually, or using any other suitable method. In some embodiments, the adhesive layer 1001 may comprise an LTHC material, a UV adhesive, a die attach film, or the like, and may be formed using a spin-on coating process, a printing process, a lamination process, or the like.

In some embodiments, the integrated circuit dies 1003 are mounted to the one or more dielectric layers 905 such that die contacts 1005 and alignment marks 1007 are facing away from or distal to the one or more dielectric layers 905. The die contacts 1005 provide an electrical connection to the electrical circuitry formed on the integrated circuit dies 1003. The die contacts 1005 may be formed on active sides of the integrated circuit dies 1003, or may be formed on backsides and comprise through vias. The die contacts 1005 may further comprise through vias providing an electrical connection between first sides and second sides of the integrated circuit dies 1003. In some embodiments, the die contacts 1005 may comprise copper, tungsten, aluminum, silver, gold, tin, a combination thereof, or the like. In some embodiments, the die contacts 1005 and the alignment marks 1007 may be formed using similar materials and methods as the contact pads 107 and the alignment marks 109 discussed above with reference to FIGS. 1A-4B and the description is not repeated herein. As discussed above, the use of the one or more alignment marks has various advantages. For example, undesired shifts or rotations of the integrated circuit dies 1003 may be reduced or avoided while mounting the integrated circuit dies 1003 onto the one or more dielectric layers 905. Moreover, damage to the integrated circuit dies 1003 caused by misalignment may be reduced or avoided.

Figure 11:
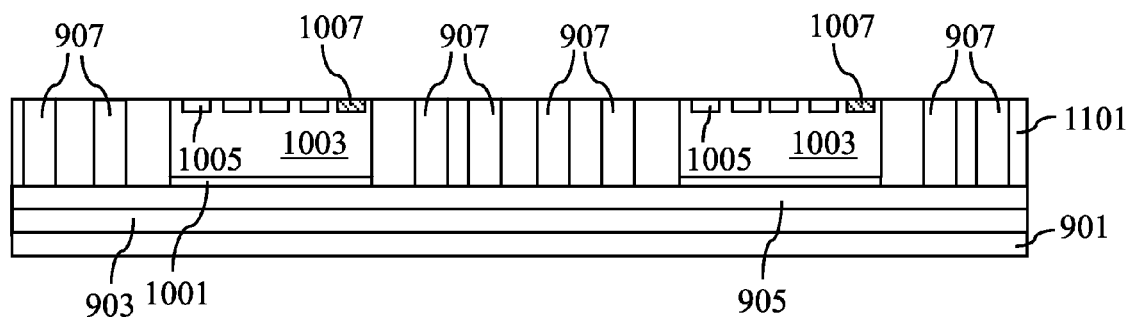

Referring to FIG. 11, an encapsulant 1101 is formed over the carrier 901, and over and surrounding the integrated circuit dies 1003 and the conductive vias 907. In some embodiments, the encapsulant 1101 may comprise a molding compound such as an epoxy, a resin, a moldable polymer, or the like. The molding compound may be applied while substantially liquid, and then may be cured through a chemical reaction, such as in an epoxy or resin. In other embodiments, the molding compound may be an ultraviolet (UV) or thermally cured polymer applied as a gel or malleable solid capable of being disposed around and between the integrated circuit dies 1003 and the conductive vias 907.

Referring further to FIG. 11, in some embodiments, a resulting structure is planarized using a CMP process, a grinding process, the like, or a combination thereof. In some embodiment, the planarization process is performed until the die contacts 1005 of the integrated circuit dies 1003 are exposed. In some embodiments, the top surfaces the conductive vias 1005 (Please confirm) are substantially coplanar with top surfaces of the conductive vias 907 and the encapsulant 1101.

Figure 12:
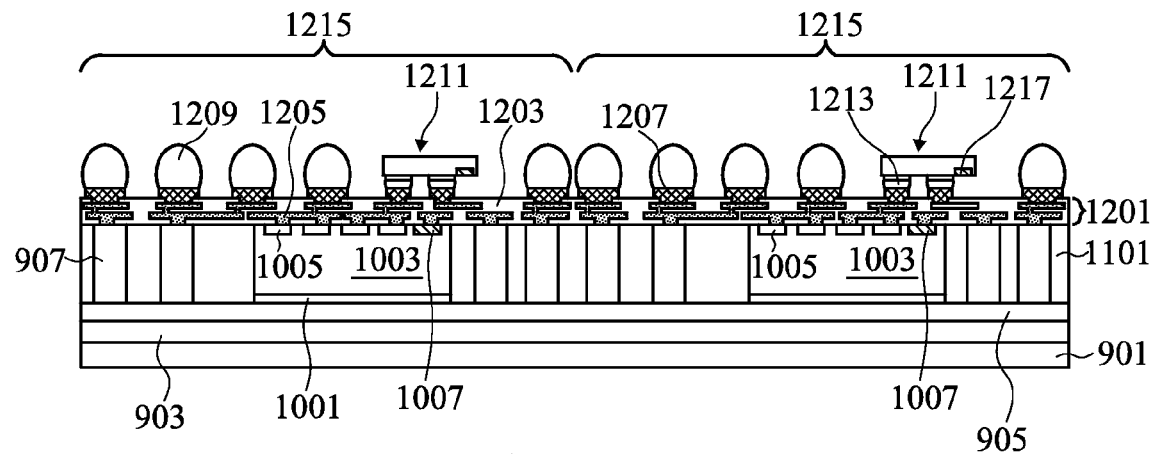

Referring to FIG. 12, one or more redistribution layers (RDLs) 1201 are formed over the integrated circuit dies 1003, the conductive vias 907 and the encapsulant 1101. In some embodiments, the RDLs 1201 comprise one or more dielectric layers 1203 and one or more conductive features 1205 disposed within the one or more dielectric layers 1203. In some embodiments, the one or more dielectric layers 1203 may be formed using similar materials and methods as the protective layer (I do not find the 1015 element in the Figures, please confirm.) described above with reference to FIG. 10, and the description is not repeated herein. In some embodiments, the one or more conductive features 1205 may comprise copper, tungsten, aluminum, silver, gold, the like, or a combination thereof, an may be formed using an electro-chemical plating process, an electroless plating process, ALD, PVD, the like, or a combination thereof.

Referring further to FIG. 12, underbump metallizations (UBMs) 1207 are formed over and electrically coupled to the RDLs 1201. In some embodiments, a set of openings may be formed through a topmost dielectric layer (not individually shown) of the one or more dielectric layers 1203 to expose the one more conductive features 1205 of the RDLs 1201. In some embodiments, the UBMs 1207 may include multiple layers of conductive materials, such as a layer of titanium, a layer of copper, and a layer of nickel. However, one of ordinary skill in the art will recognize that there are many suitable arrangements of materials and layers, such as an arrangement of chrome/chrome-copper alloy/copper/gold, an arrangement of titanium/titanium tungsten/copper, or an arrangement of copper/nickel/gold, that are suitable for the formation of the UBMs 1207. Any suitable materials or layers of material that may be used for the UBMs 1207 are fully intended to be included within the scope of the current application. In some embodiments, connectors 1209 are formed over and electrically coupled to some of the UBMs 1207. In some embodiments, the connectors 1209 may be formed using similar materials and methods as the connectors 401 described above with reference to FIGS. 4A and 4B, and the description is not repeated herein.

Referring further to FIG. 12, integrated circuit dies 1211 are mounted over and electrically coupled to the RDLs 1201. In some embodiments, connectors 1213 of the integrated circuit dies 1211 are used to attach the integrated circuit dies 1211 to the UBMs 1207, while alignment marks 1217 of the integrated circuit dies 1211 are used to properly align the integrated circuit dies 1211 over the RDLs 1201. In some embodiments, the integrated circuit dies 1211 may be similar to the integrated circuit dies 500, 600 and/or 700 (See FIGS. 5-7), may be formed using methods similar to those described above with reference to FIGS. 1A-4B, and the description is not repeated herein. In some embodiments, the connectors 1213 and the alignment marks 1217 may be formed using similar materials and methods as the connectors 401 and the alignment marks 109, respectively, described above with reference to FIGS. 1A-4B, and the description is not repeated herein. In some embodiments, the integrated circuit dies 1211 may be placed on the RDLs 1201 using, for example, a pick-and-place apparatus. In some embodiments, the pick-and-place apparatus may use the alignment marks 1217 of the integrated circuit dies 1211 to properly align the integrated circuit dies 1211 over the RDLs 1201. By using the alignment marks 1217, undesired shift and rotation of the integrated circuit dies 1211 may be reduced or avoided. Moreover, damage of the integrated circuit dies 1211 due to misalignment may be reduced or avoided. In other embodiments, the integrated circuit dies 1211 may be placed on the RDLs 1201 manually, or using any other suitable method. In the illustrated embodiment, the integrated circuit dies 1211 are discrete semiconductor device chips. However, in other embodiments, the integrated circuit dies 1211 may be any suitable integrated circuit dies providing desired functionality.

In some embodiments, after mounting the integrated circuit dies 1211 over the RDLs 1201, the resulting structure is detached from the carrier 901 and diced to form individual integrated circuit packages 1215. In some embodiments, the resulting structure may be diced by sawing, a laser ablation method, or the like. Subsequently, each of the integrated circuit packages 1215 may be tested to identify known good packages (KGPs) for further processing.

Figure 13:
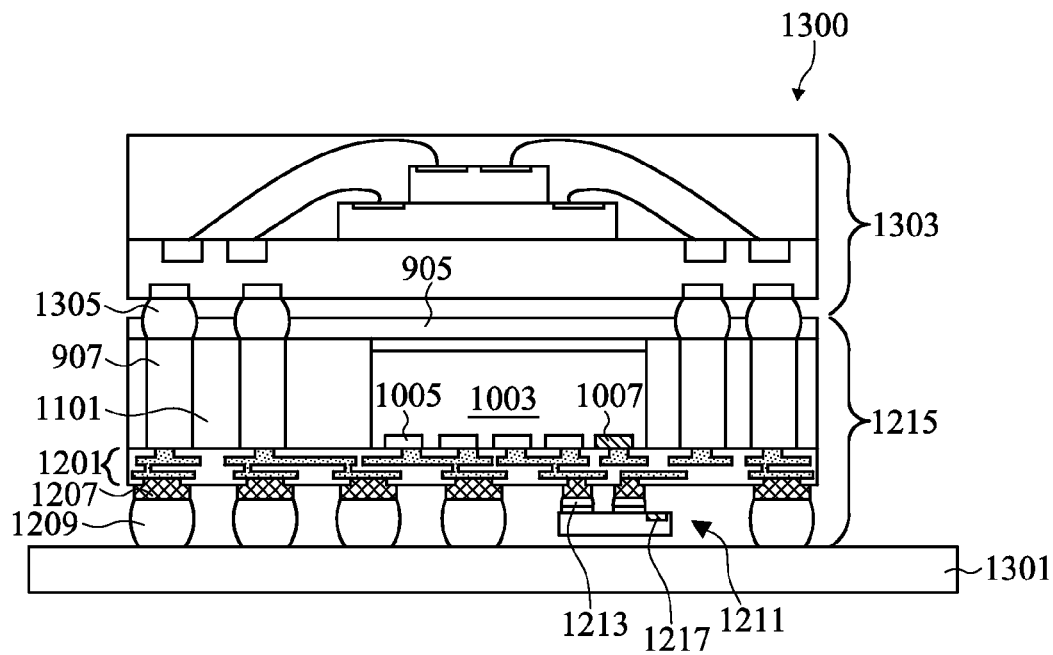

FIG. 13 illustrates a bonding process of a workpiece 1303 to the integrated circuit package 1215 with a set of connectors 1305 extending through openings in the one or more dielectric layers 905 to form a stacked semiconductor device 1300. In some embodiments, the workpiece 1303 may be a package, one or more dies, a printed circuit board (PCB), a package substrate, an interposer, or the like. In some embodiments wherein the workpiece 1303 is a package, the stacked semiconductor device 1300 is a package-on package (PoP) device. In other embodiments wherein the workpiece 1303 is a die, the stacked semiconductor device 1300 is a chip-on-package (CoP) device. In some embodiments, the connectors 1305 may be formed using similar material and methods as the connectors 401 described above with reference to FIGS. 3A-4B, and the description is not repeated herein. In some embodiments, the workpiece 1303 may be bonded to the integrated circuit package 1215 before the dicing process described above with reference to FIG. 12.

Referring further to FIG. 13, an underfill material (not shown) may be injected or otherwise formed in the space between the workpiece 1303 and the integrated circuit package 1215 and surrounding the connectors 1305. The underfill material may, for example, be a liquid epoxy, deformable gel, silicon rubber, or the like, that is dispensed between the structures, and then cured to harden. This underfill material may be used, among other things, to reduce damage to and to protect the connectors 1305.

Referring further to FIG. 13, in some embodiments, the stacked semiconductor device 1300 may be bonded to a workpiece 1301 using the connectors 1209. In some embodiments, the workpiece 1301 may be similar to the workpiece 1303 and the description is not repeated herein. In the illustrated embodiment, the workpiece 1301 is a printed circuit board (PCB).

Figure 14:
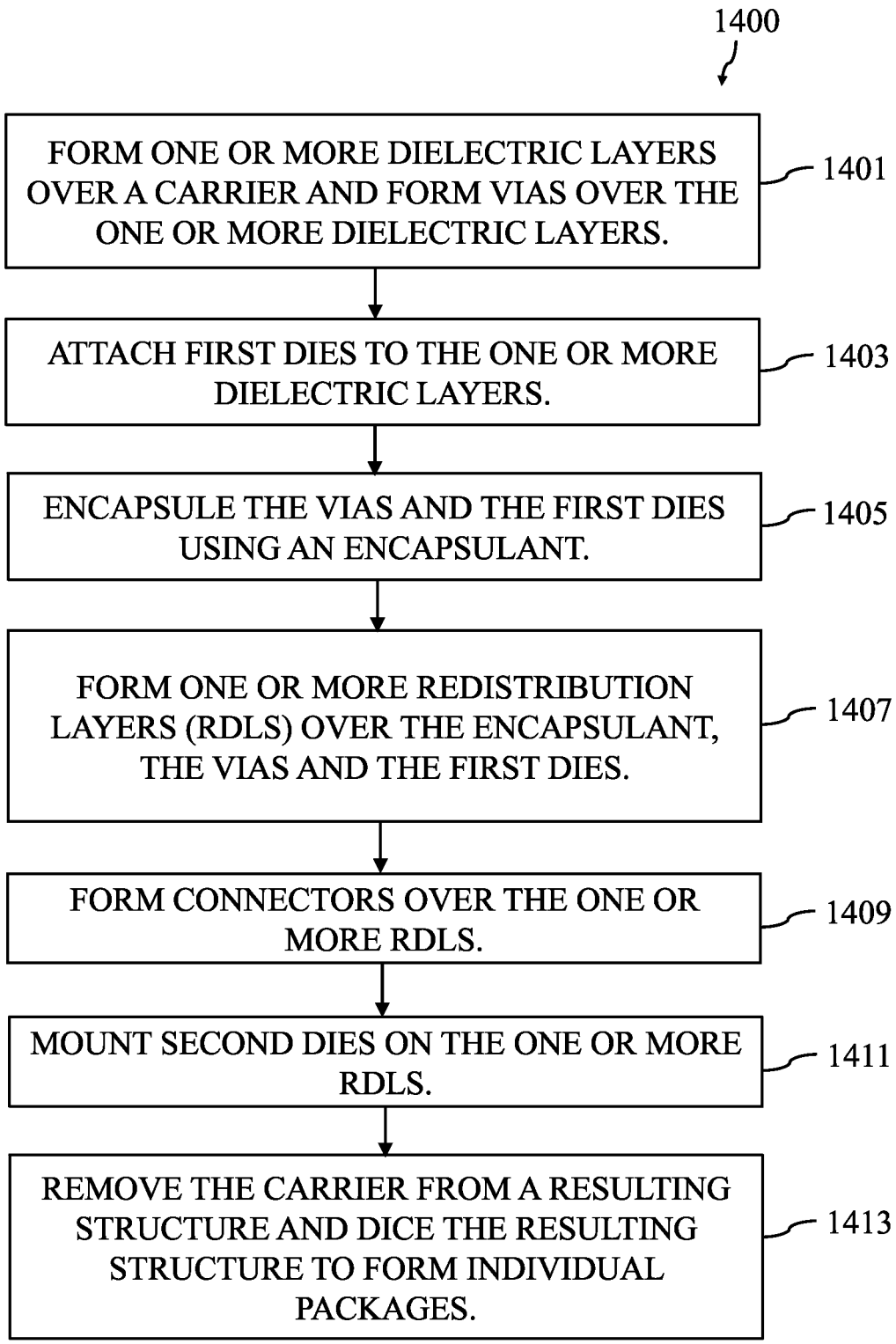
FIG. 14 is a flow diagram illustrating a method of forming integrated circuit packages in accordance with some embodiments.

FIG. 14 is a flow diagram illustrating a method 1400 of forming integrated circuit packages in accordance with some embodiments. The method 1400 starts with step 1401, wherein one or more dielectric layers (such as the one or more dielectric layers 905) are formed over a carrier (such as the carrier 901) as described above with reference to FIG. 9. Subsequently, conductive vias (such as the conductive vias 907) are formed over the one or more dielectric layers as described above with reference to FIG. 9. In step 1403, first dies (such as the integrated circuit dies 1003) are attached to the one or more dielectric layers as described above with reference to FIG. 10. In step 1405, an encapsulant (such as the encapsulant 1101) is formed to encapsulate the conductive vias and the first dies as described above with reference to FIG. 11. In step 1407, one or more redistribution layers (such as the RDLs 1201) are formed over the encapsulated first dies and the conductive vias as described above with reference to FIG. 12. In step 1409, connectors (such as the connectors 1209) are formed over the one or more RDLs as described above with reference to FIG. 12. In step 1411, second dies (such as the integrated circuit dies 1211) are mounted on the one or more RDLs as described above with reference to FIG. 12. In Step 1413, a resulting structure is debonded from the carrier and diced to form individual integrated circuit packages (such as the integrated circuit packages 1215) as described above with reference to FIG. 12.

According to an embodiment, a method includes forming a device on a substrate. A plurality of contact pads is formed over the substrate and the device. Simultaneously with forming the plurality of contact pads, one or more alignment marks are formed over the substrate and the device.

According to another embodiment, a method includes forming a device on a substrate. One or more metallization layers are formed over the substrate and the device. A conductive layer is formed on the one or more metallization layers. The conductive layer is patterned to form a plurality of contact pads and one or more alignment marks, the one or more alignment marks being electrically isolated from the device.

According to yet another embodiment, a semiconductor device includes a substrate, a device on the substrate, and a dielectric layer over the substrate and the device. The semiconductor device further includes a contact pad on the dielectric layer, and a first alignment mark on the dielectric layer, the first alignment mark being electrically isolated from the device, the contact pad and the first alignment mark being formed of a same material, the contact pad and the first alignment mark being at a same level.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method comprising:
   forming a device on a substrate;
   after forming the device, forming a plurality of contact pads over the substrate and the device; and
   simultaneously with forming the plurality of contact pads, forming one or more alignment marks over the substrate and the device;
   forming a passivation layer over the plurality of contact pads and the one or more alignment marks; and
   patterning the passivation layer to form a plurality of openings in the passivation layer, wherein each of the plurality of openings exposes a first portion of a top surface of a respective one of the plurality of contact pads, and wherein a second portion of the top surface of the respective one of the plurality of contact pads remains unexposed after the patterning.

2. The method of claim 1, further comprising:
   dicing the substrate to form a die, the die having at least one alignment mark;
   aligning, using the at least one alignment mark, the die to a workpiece; and
   attaching the die to the workpiece.

3. The method of claim 2, wherein the die is a discrete semiconductor device chip.

4. The method of claim 2, wherein the workpiece comprises a plurality of encapsulated dies and one or more redistribution lines (RDLs) on plurality of encapsulated dies, the die being attached to the one or more RDLs, the one or more RDLs being interposed between the plurality of encapsulated dies and the die.

5. The method of claim 1, wherein forming the plurality of contact pads and the one or more alignment marks comprises:

depositing a conductive layer over the substrate and the device; and patterning the conductive layer to form the plurality of contact pads and the one or more alignment marks.

6. The method of claim 1, further comprising forming connectors on the plurality of contact pads.

7. The method of claim 1, wherein the one or more alignment marks are electrically isolated from the device.

8. A method comprising:

forming a device on a substrate;

forming one or more metallization layers over the substrate and the device;

after forming the one or more metallization layers, forming a conductive layer over the one or more metallization layers;

patterning the conductive layer to form a plurality of contact pads and one or more alignment marks, the one or more alignment marks being electrically isolated from the device; and forming a patterned passivation layer over the plurality of contact pads and the one or more alignment marks, the patterned passivation layer covering entire top surfaces of the one or more alignment marks and portions of top surfaces of the plurality of contact pads.

9. The method of claim 8, further comprising:

singulating the substrate to form a singulated die, the singulated die having at least one alignment mark;

aligning, using the at least one alignment mark, the singulated die to a workpiece; and attaching the singulated die to the workpiece.

10. The method of claim 9, wherein the workpiece comprises a plurality of encapsulated dies and one or more redistribution lines (RDLs) on plurality of encapsulated dies, the singulated die being attached to the one or more RDLs, the one or more RDLs being interposed between the singulated die and the plurality of encapsulated dies.

11. The method of claim 9, wherein the singulated die is a discrete semiconductor device chip.

12. The method of claim 8, further comprising forming connectors on the plurality of contact pads.

13. The method of claim 8, wherein each of the one or more alignment marks has a polygonal shape as viewed from top.

14. A method comprising:

forming a device on a substrate;

depositing a dielectric layer over the substrate and the device;

depositing a conductive layer over the dielectric layer;

etching the conductive layer to form a plurality of contact pads and a plurality of alignment marks, the plurality of alignment marks being electrically isolated from the plurality of contact pads;

blanket depositing a passivation layer over the plurality of contact pads and the plurality of alignment marks; and etching the passivation layer to form a plurality of openings in the passivation layer, wherein each of the plurality of openings exposes a first portion of a top surface of a respective one of the plurality of contact pads, and wherein at least a portion of the passivation layer contacts a second portion of the top surface of the respective one of the plurality of contact pads after the etching.

15. The method of claim 14, further comprising forming a plurality of connectors over the plurality of contact pads, wherein each of the plurality of connectors extends through a respective one of the plurality of openings and physically contacts a respective one of the plurality of contact pads.

16. The method of claim 15, further comprising:

singulating the substrate to form a singulated die, the singulated die having at least one alignment mark;

aligning, using the at least one alignment mark, the singulated die to a workpiece; and attaching the singulated die to the workpiece.

17. The method of claim 16, wherein the at least one alignment mark is located at a corner of the singulated die.

18. The method of claim 14, wherein each of the plurality of alignment marks has a polygonal shape as viewed from top.

19. The method of claim 12, wherein portions of the connectors laterally extend over the patterned passivation layer.

20. The method of claim 15, wherein at least a portion of the passivation layer is interposed between each of the plurality of connectors and a respective one of the plurality of contact pads.

* * * * *